United States Patent
Kim

(10) Patent No.: US 9,798,019 B2
(45) Date of Patent: Oct. 24, 2017

(54) X-RAY DETECTOR AND METHOD OF MANUFACTURING THE SAME AND SYSTEM INCLUDING X-RAY DETECTOR AND METHOD OF OPERATING THE SAME

(71) Applicant: SAMSUNG ELECTRONICS CO., LTD., Suwon-si (KR)

(72) Inventor: Sang-uk Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/921,232

(22) Filed: Oct. 23, 2015

(65) Prior Publication Data

US 2016/0116608 A1     Apr. 28, 2016

(30) Foreign Application Priority Data

Oct. 24, 2014  (KR) .................. 10-2014-0145388

(51) Int. Cl.
| | |
|---|---|
| G01T 1/24 | (2006.01) |
| H01L 27/146 | (2006.01) |
| H04N 5/32 | (2006.01) |

(52) U.S. Cl.
CPC .......... *G01T 1/241* (2013.01); *H01L 27/1463* (2013.01); *H01L 27/14636* (2013.01); *H01L 27/14658* (2013.01); *H01L 27/14683* (2013.01); *H01L 27/14692* (2013.01); *H04N 5/32* (2013.01)

(58) Field of Classification Search
CPC ....................................................... G01T 1/241
See application file for complete search history.

(56) References Cited

U.S. PATENT DOCUMENTS

| | | | |
|---|---|---|---|
| 5,751,783 A | 5/1998 | Granfors et al. | |
| 6,404,851 B1 | 6/2002 | Possin et al. | |
| 6,437,341 B1 * | 8/2002 | Izumi ................ | H01L 27/14676 250/370.08 |
| 7,211,803 B1 | 5/2007 | Dhurjaty et al. | |
| 7,368,724 B2 | 5/2008 | Morii et al. | |

(Continued)

FOREIGN PATENT DOCUMENTS

| | | |
|---|---|---|
| JP | 2007-044135 | 2/2007 |
| KR | 10-2011-0110583 | 10/2011 |
| KR | 10-2012-0095151 | 8/2012 |

OTHER PUBLICATIONS

International Search Report and Written Opinion of the International Searching Authority dated Feb. 3, 2016 in corresponding to International Patent Application No. PCT/KR2015/01126.

*Primary Examiner* — David Porta
*Assistant Examiner* — Hugh H Maupin
(74) *Attorney, Agent, or Firm* — Staas & Halsey LLP

(57) ABSTRACT

An X-ray detector may include a plurality of pixels on a substrate, a first insulating layer configured to cover the plurality of pixels, an electrode block configured to penetrate the first insulating layer and be in contact with the plurality of pixels, a second insulating layer on the electrode block, and a metal wire configured to penetrate the second insulating layer and be in contact with the electrode block. Each of the plurality of pixels may include a first electrode on the substrate, a photoelectronic conversion device on the first electrode, and a second electrode on the photoelectronic conversion device.

22 Claims, 10 Drawing Sheets

(56) References Cited

U.S. PATENT DOCUMENTS

| | | |
|---|---|---|
| 7,769,137 B2 | 8/2010 | Maack et al. |
| 8,766,202 B2 | 7/2014 | Kim et al. |
| 2003/0038241 A1 | 2/2003 | Choo et al. |
| 2004/0156473 A1 | 8/2004 | Nonaka et al. |
| 2011/0168909 A1* | 7/2011 | Nakao et al. ............ 250/370.09 |
| 2011/0241143 A1 | 10/2011 | Kim et al. |
| 2013/0202086 A1 | 8/2013 | Tsuji |
| 2013/0284935 A1 | 10/2013 | Kaneko et al. |
| 2014/0085520 A1* | 3/2014 | Taura ................ H01L 27/14609 348/300 |
| 2016/0014362 A1* | 1/2016 | Kurokawa ................... 250/371 |

* cited by examiner

X-RAY DETECTOR AND METHOD OF MANUFACTURING THE SAME AND SYSTEM INCLUDING X-RAY DETECTOR AND METHOD OF OPERATING THE SAME

CROSS-REFERENCE TO RELATED APPLICATION

This application claims the benefit of Korean Patent Application No. 10-2014-0145388, filed on Oct. 24, 2014, in the Korean Intellectual Property Office, the disclosure of which is incorporated herein in its entirety by reference.

BACKGROUND

1. Field

Example embodiments relate to medical equipments, to X-ray detectors and methods of manufacturing the same, and systems including the X-ray detector and methods of operating the same.

2. Description of the Related Art

A frequency of use of wireless X-ray detectors has increased. When an X-ray detector is used outside a bucky, X-ray photographing is performed using manual exposure. In this case, a problem occurs in that an X-ray irradiation dose may vary depending on radiology equipment manufacturers.

Accordingly, two methods of controlling an X-ray radiation dose have been introduced; a method of calculating a total amount of incident light by measuring a current flowing along a back bias surface of the X-ray detector and a method of installing an automatic exposure control (AEC) dedicated sensor by utilizing a separate pattern on a thin film transistor (TFT) backplane.

The former method is a simple and straightforward method of calculating the total amount of incident light. However, when the total amount of incident light is calculated, a large error may occur due to an unnecessary amount of ambient light which occupies a major portion of a measurement value, while a main purpose of AEC is to measure an amount of light of a subject in an area of interest.

In the latter method, pixels for image photographing may not be placed in a region occupied by an AEC dedicated sensor that is separately placed. Accordingly, a problem with respect to a regional resolution may occur and in addition, since an AEC dedicated sensor may not be placed to cover a wide region, a representability problem of the measurement value may occur. In other words, a reliability of the measurement value may decrease.

SUMMARY

Example embodiments relate to X-ray detectors having an automatic exposure control (AEC) capability in an independent or a wireless state and capable of arbitrarily selecting an AEC region on a panel, and methods of manufacturing the X-ray detector.

Example embodiments relate to systems including the X-ray detector and methods of operating the same.

Additional example embodiments will be set forth in part in the description which follows and, in part, will be apparent from the description, or may be learned by practice of the example embodiments.

According to an example embodiment, the X-ray detector may include a plurality of pixels on a substrate, a first insulating layer configured to cover the plurality of pixels, an electrode block configured to pass through the first insulating layer and be in contact with the plurality of pixels, a second insulating layer on the electrode block, and a metal wire configured to pass through the second insulating layer and be in contact with the electrode block.

In the X-ray detector, each of the plurality of pixels may include a first electrode on the substrate, a photoelectronic conversion device on the first electrode, and a second electrode on the photoelectronic conversion device.

The plurality of pixels and a same number of contact holes may exist on the first insulating layer, and the electrode block may fill the contact hole.

A plurality of contact holes, through which the electrode block may be exposed, may be in the second insulating layer, and the metal wire may fill up the contact holes.

A plurality of metal wires may be on the second insulating layer, and the plurality of metal wires may be in contact with the electrode blocks different from each other.

The second insulating layer may have a thickness equal to or greater than about 500 nm, and have an upper thickness limit.

The electrode block may include a plurality of contact holes between two adjacent pixels among the plurality of pixels.

A width of the electrode block may be narrower than that of other portions between two adjacent pixels among the plurality of pixels.

According to an example embodiment, a method of manufacturing an X-ray detector may include a process of forming a plurality of pixels on a substrate, the process of forming a first insulating layer configured to cover the plurality of pixels on the substrate, the process of forming a plurality of first contact holes, through which a plurality of pixels may be exposed, on the first insulating layer, the process of forming an electrode block configured to fill the plurality of first contact holes on the first insulating layer, the process of forming a second insulating layer on the electrode block, the process of forming a second contact hole, through which a portion of the electrode block may be exposed, on the second insulating layer, and the process of forming a metal wire configured to fill the second contact hole in the second insulating layer.

In the method of manufacturing the X-ray detector, the process of forming the plurality of pixels may include the process of forming a first electrode on the substrate, the process of forming a photoelectronic conversion device on the first electrode, and the process of forming a second electrode on the photoelectronic conversion device.

The electrode block may cover a surface exposed through the first contact holes, without filling the first contact holes.

In the process of forming the electrode block, a plurality of contact holes may be formed in the electrode block between two adjacent pixels among the plurality of pixels.

A width of the electrode block between two adjacent pixels among the plurality of pixels may be formed narrower than that of other portions.

A plurality of electrode blocks spaced apart from each other may be formed on the first insulating layer, a plurality of metal wires may be formed on the second insulating layer, and the plurality of metal wires may be in contact with the electrode blocks different from each other.

According to an example embodiment, an X-ray detector system may include an X-ray detector including a plurality of electrode blocks, an array connected to the plurality of electrode blocks, a control unit connected to the array, and a wireless transmitter connected to the control unit.

In the X-ray detector system, the array may include a first array including a plurality of amplifiers in one-to-one correspondence with the plurality of electrode blocks, and a second array including a plurality of comparators in one-to-one correspondence with the plurality of amplifiers.

The X-ray detector system may further include a wireless receiver configured to receive a signal provided by the control unit, and a high voltage generator connected to the wireless receiver.

According to an example embodiment, a method of operating an X-ray detector system may include a process of selecting an electrode block from an electrode block layer, the process of operating an amplifier only connected to the selected electrode block out of an amplifier array connected to the electrode block layer, the process of applying a threshold voltage, which is determined as one of input signals, to a comparator connected to the operated amplifier, the process of irradiating an X-ray to the selected electrode block, the process of comparing a signal provided by the operated amplifier with the applied threshold voltage after the X-ray irradiation has started, and the process of controlling the X-ray irradiation in accordance with the comparison result.

In the method of operating the X-ray detector system, the process of controlling the X-ray irradiation in accordance with the comparison result may include the process of transmitting the comparison result to a control unit, the process of generating a control signal in the control unit in accordance with the comparison result, and the process of transmitting the control signal to a high voltage generator.

The amplifier array may include a plurality of amplifiers, and the plurality of amplifiers may be in one-to-one correspondence with a plurality of electrode blocks included in the electrode block layer.

According to an example embodiment, an X-ray detector may include a substrate, pixels on the substrate, a first insulating layer configured to substantially cover the pixels, an electrode block configured to pass through the first insulating layer and be in electrical contact with the pixels, a second insulating layer to substantially cover the electrode block, and a metal wire configured to pass through the second insulating layer and be in electrical contact with the electrode block.

According to an example embodiment, a method of manufacturing an X-ray detector may include forming pixels on a substrate, forming a first insulating layer, configured to cover the plurality of pixels, on the substrate, forming a plurality of first via holes, through which the plurality of pixels are exposed, in the first insulating layer; forming an electrode block, configured to fill the plurality of the first via holes, on the first insulating layer, forming a second insulating layer on the electrode block, forming a second contact hole, through which a portion of the electrode block is exposed, in the second insulating layer, and forming a metal wire, configured to fill the second contact hole, on the second insulating layer.

According to an example embodiment, an X-ray detector may include a substrate, pixels on the substrate each pixel may include a first electrode on the substrate, a photoelectronic conversion device on the first electrode and a second electrode on the photoelectronic conversion device, a first insulating layer configured to substantially cover the pixels and the substrate, and having first through-vias to each of the first electrode the pixels, an electrode block configured to pass through the first insulating layer using the first through-vias and be in electrical contact with the pixels, a second insulating layer to substantially cover the electrode block and having a second through-via to the electrode block, and a metal wire configured to pass through the second insulating layer using the second through-via and be in electrical contact with the electrode block.

BRIEF DESCRIPTION OF THE DRAWINGS

These and/or other example embodiments will become apparent and more readily appreciated from the following description taken in conjunction with the accompanying drawings in which.

DETAILED DESCRIPTION

Figure 1:
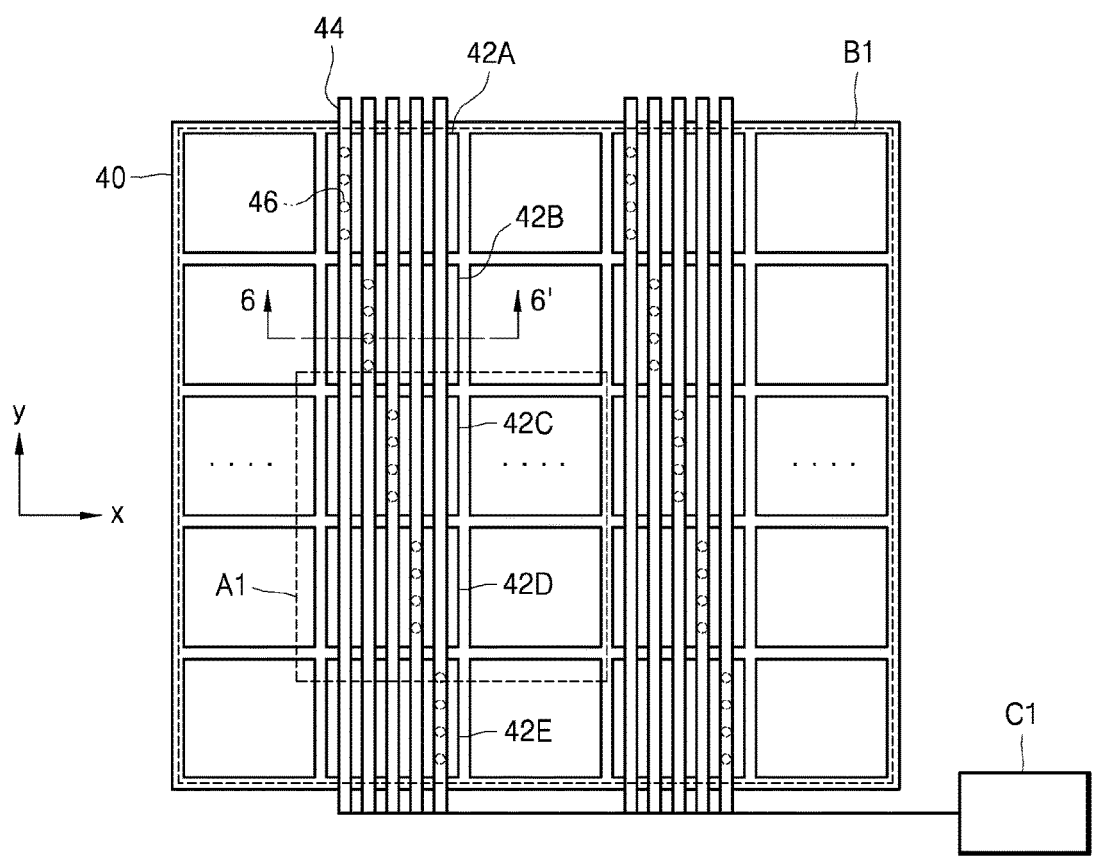
FIG. 1 is a plan view of an X-ray detector according to an example embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. Expressions such as "at least one of," when preceding a list of elements, modify the entire list of elements and do not modify the individual elements of the list.

An expression used in the singular may encompass the expression of the plural, unless it has a clearly different meaning in the context.

An X-ray detector is described with reference to FIGS. 1 through 6 according to example embodiments.

FIG. 1 is a plan view of the X-ray detector according to an example embodiment.

Referring to FIG. 1, a panel 40 of the X-ray detector may include an electrode block layer B1. The electrode block layer B1 may be a back bias electrode block. The electrode block layer B1 may include a plurality of electrode blocks arranged in a matrix shape. FIG. 1 illustrates that 25 electrode blocks are included in the electrode block layer B1 for the sake of convenience; however, the number of electrode blocks may be more or less than 25. Electrode blocks included in the electrode block layer B1 may be spaced apart from each other. Electrode blocks included in the electrode block layer B1 may be connected to a plurality of metal wires 44. The plurality of metal wires 44 may traverse the electrode block layer B1 and be arranged in a y-axis direction. The electrode block layer B1 may include electrode blocks in 5 rows by 5 columns, and 5 pieces of metal wires 44 may be arranged on each column. The electrode blocks and the metal wires 44 may be in one-to-one contact with each other on each column of the electrode block layer B1. For example, a first wire that is a far left wire of 5 pieces of metal wires 44 traversing a second column of the electrode block layer B1 may be in contact with an electrode block 42A located at a first row and second column of the electrode block layer B1, and a second wire that is the second wire from the left of the metal wire 44 may be in contact with an electrode block 42B located at a second row and second column of the electrode block layer B1. Also, third, fourth and fifth wires that are the third, fourth and fifth wires, respectively, from the left of the metal wire 44 may each be in contact with electrode blocks 42C, 42D, 42E located at a third row and second column, a fourth row and second column, and a fifth row and second column, respectively, of the electrode block layer B1. Contacts between the metal wire 44 and electrode blocks 42A through 42E may be possible through contact holes 46. A plurality of contact holes 46 may exist between each of the metal wires 44 and a corresponding electrode block in contact therewith. Since the metal wires 44 and electrode blocks included in the electrode block layer B1 may be in one-to-one contact with each other, the number of metal wires 44 traversing each column may be equal to the number of electrode blocks forming each column. For example, when 10 pieces of electrode blocks may exist on each column of the electrode block layer B1, the number of metal wires 44 traversing each column of the electrode block layer B1 may be 10. The metal wires 44 may be formed of a metal with a relatively low resistance, such as aluminum or an aluminum alloy. The metal wire 44 may be connected to a cumulative ammeter circuit C1 for measuring a cumulative current value. The cumulative ammeter circuit C1 may include a constant voltage source. The cumulative ammeter circuit C1 may measure a cumulative current at each electrode block of the electrode block layer B1. Automatic exposure control (AEC) may be performed through such measurement. Also, since an arbitrary region among electrode blocks included in the electrode block layer B1 may be selected, a region of AEC may be arbitrarily determined. For example, when a thickest portion of a subject, or a portion determined to be in need of a highest X-ray irradiation dose, is located on a first region A1, the first region A1 may be determined to be an AEC region. Also, the AEC may be performed by measuring the cumulative current of electrode blocks located at a third row and second column, a third row and third column, a fourth row and second column, and a fourth row and third column. In this manner, the arbitrary region or an entire region of the electrode block layer B1 may be determined as the AEC region and the AEC may be performed.

Figure 2:
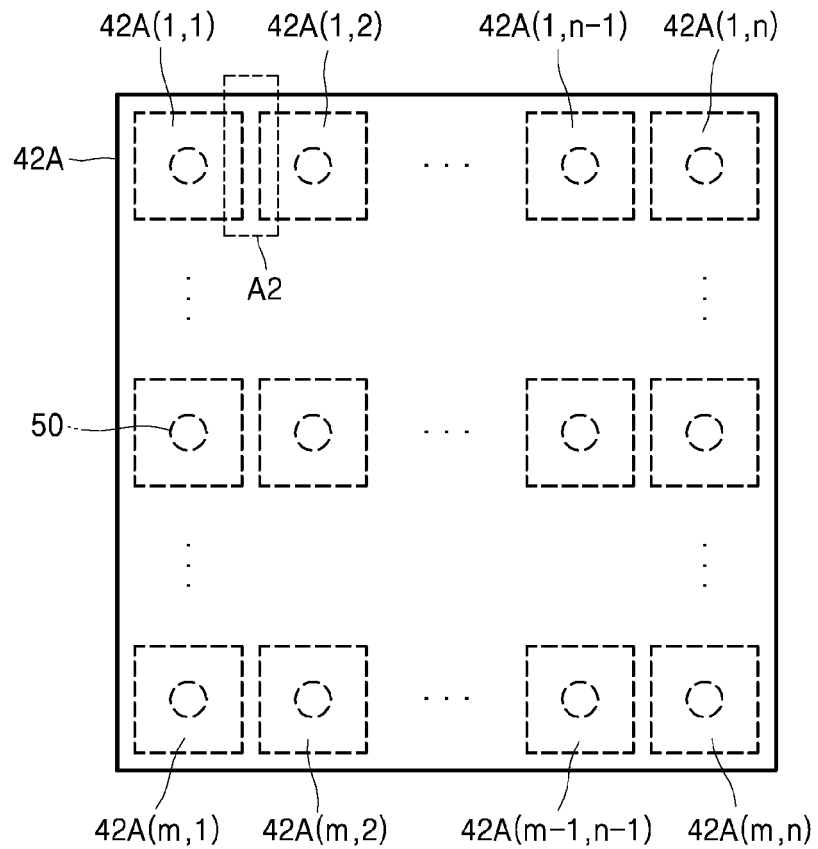
FIG. 2 is an enlarged plan view of a single electrode block from among electrode blocks included in an electrode block layer in FIG. 1.

FIG. 2 is an enlarged plan view of a single electrode block from among electrode blocks included in the electrode block layer B1 in FIG. 1, for example, the electrode block 42A placed at a first row and second column. Since the electrode block 42A is a transparent electrode layer, elements placed therebelow are illustrated also. The metal wire 44 traversing the electrode block 42A is omitted for the sake of convenience.

Referring to FIG. 2, a plurality of pixels, 42A(1,1) . . . 42A(1,n) . . . 42A(m,1) . . . 42A(m,n), may correspond to one electrode block 42A. In other words, the plurality of pixels, 42A(1,1) . . . 42A(1,n) . . . 42A(m,1) . . . 42A(m,n), may be arranged beneath a single electrode block 42A. The plurality of pixels, 42A(1,1) . . . 42A(1,n) . . . 42A(m,1) . . . 42A(m,n), may form a matrix of m rows and n columns. Here, m and n may be 1, 2, 3 . . . The electrode block 42A and the plurality of pixels, 42A(1,1) . . . 42A(1,n) . . . 42A(m,1) . . . 42A(m,n), may be connected to each other through a contact hole 50 between the electrode block 42A and each of pixels, 42A(1,1) . . . 42A(1,n) . . . 42A(m,1) . . . 42A(m,n).

Figure 3:
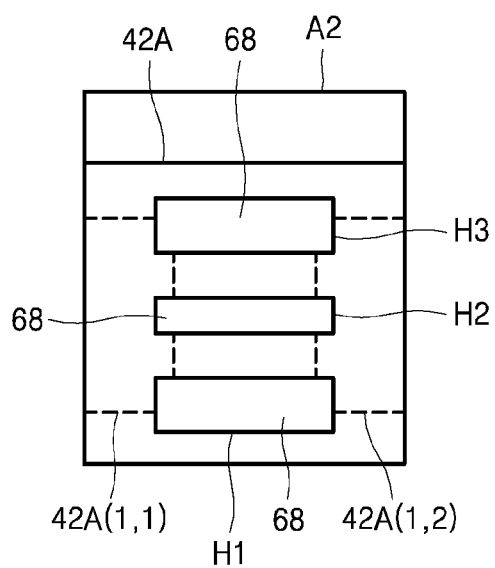
FIG. 3 and FIG. 4 are enlarged plan views of a second region in FIG. 2.

FIG. 3 is an enlarged plan view of a second region A2 in FIG. 2.

Referring to FIG. 3, the electrode block 42A may include a plurality of penetrating holes H1-H3 between two pixels 42A(1,1) and 42A(1,2). A first insulating layer 68 may be exposed through the plurality of penetrating holes H1-H3. A region size of the electrode block 42A between two pixels 42A(1,1) and 42A(1,2) may be relatively smaller than that of other regions due to the existence of the plurality of penetration holes H1-H3. A reason for forming the region of the electrode block 42A between the two pixels 42A(1,1) and 42A(1,2) to be relatively smaller than that of other regions is to reduce parasite capacitances between a data line, not illustrated, passing between two pixels 42A(1,1) and 42A (1,2), a data line passing between columns of pixels, and the electrode block 42A. The number of the penetrating holes H1-H3 may be appropriately adjusted. A diameter of the penetrating holes H1-H3 may be, for example, about 5 μm.

Figure 4:
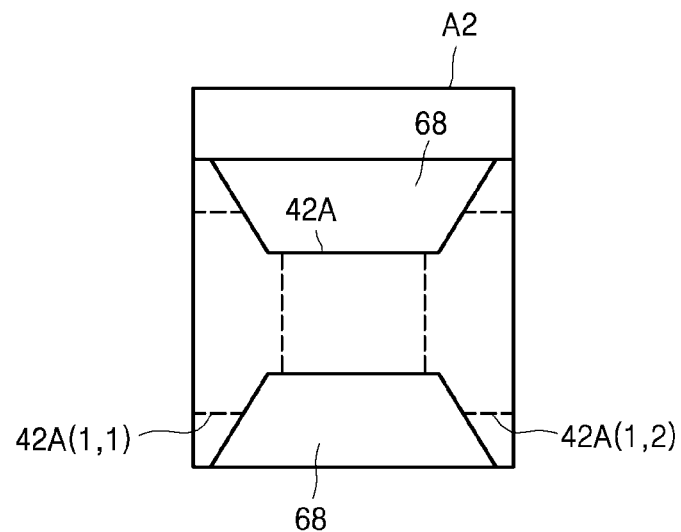

FIG. 4 is an enlarged plan view of the second region A2 in FIG. 2.

FIG. 4 illustrates an example of the second region A2 that is different from that in FIG. 3.

Referring to FIG. 4, a width of the electrode block 42A between two adjacent pixels 42A(1,1) and 42A(1,2) may be relatively narrower than that of other regions. A reason for forming the width of the electrode block 42A between the two pixels 42A(1,1) and 42A(1,2) to be relatively narrower than that of other regions is to reduce the parasite capacitance between the data line passing through between the two pixels 42A(1,1) and 42A(1,2) and the electrode block 42A.

Figure 5:
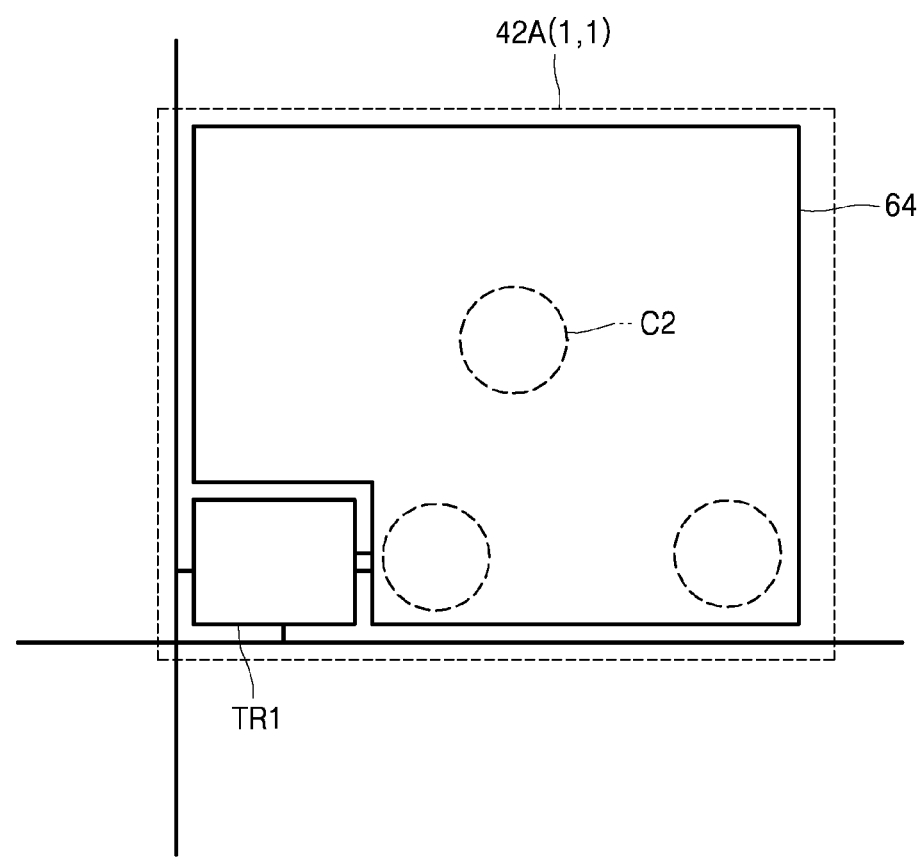
FIG. 5 is an enlarged plan view of a single pixel from among pixels in FIG. 2.

FIG. 5 is an enlarged plan view of a single pixel among pixels in FIG. 2, for example, the pixel located at a first row and first column 42(1,1).

Referring to FIG. 5, the pixel 42A(1,1) may include one of a photoelectronic conversion device 64 and one of a switching device TR1 connected thereto. The photoelectronic conversion device 64 may be, for example, a photodiode. The photodiode may be, for example, an amorphous silicon based photodiode. The switching device TR1 may be, for example, a thin film transistor (TFT). The switching device TR1 may be connected to data lines and word lines crossing each other. In FIG. 5, a dotted circle C2 indicates a contact region in contact with the electrode block 42A. The contact region C2 may be located at the center of the photoelectronic conversion device 64, but may be located at a right bottom area or near the switching device TR1 as well.

Figure 6:
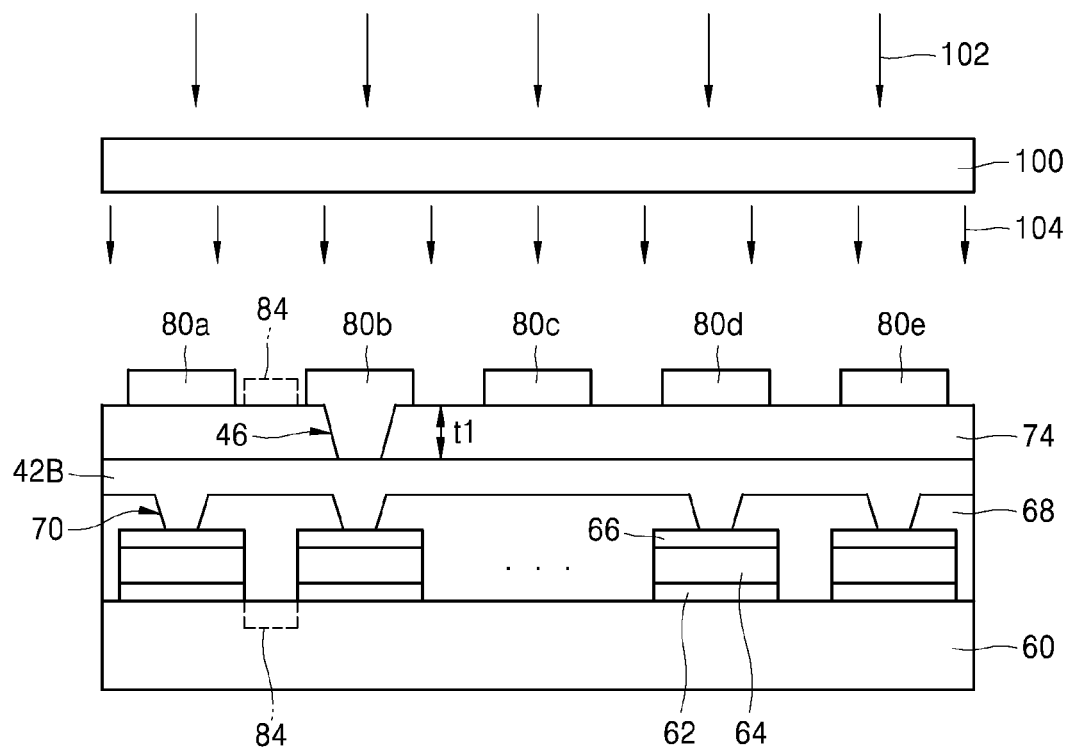
FIG. 6 is a cross-sectional view of FIG. 1, cut along a line 6-6'.

FIG. 6 is a cross-sectional view of FIG. 1, cut along a line 6-6'.

Referring to FIG. 6, a plurality of first electrode 62 spaced apart from each other may be on a substrate 60. The substrate 60 may be, for example, a glass substrate. The photoelectronic conversion device 64 and a second electrode 66 may be sequentially laminated above each first electrode 62. The first electrode 62 may be a pixel electrode. The second electrode 66 may be a first back bias electrode. The second electrode 66 may a transparent electrode. For the sake of convenience, the first electrode 62, the photoelectronic conversion device 64 and the second electrode 66 may be commonly referred to as photoelectronic conversion devices. The first insulating layer 68 configured to cover the first electrode 62, the photoelectronic conversion device 64 and the second electrode 66 may be on the substrate 60. The first insulating layer 68 may include a transparent insulating material. The first insulating layer 68 may be, for example, a silicon nitride layer, a silicon oxide layer or an organic layer. The first insulating layer 68 may include a plurality of contact holes 70. The number of contact holes 70 may be equal to that of the photoelectronic conversion device 64. The plurality of contact holes 70 may be in one-to-one correspondence with the second electrode 66. The second electrode 66 may be exposed through each contact hole 70. The electrode block 42B configured to fill the contact hole 70 may be on the first insulating layer 68. The electrode block 42B may be a second back bias electrode. The electrode block 42B may be in contact with the second electrode 66 through the contact hole 70. The electrode block 42B may be an electrode layer filling the contact hole 70. The electrode block 42B may not fill the contact hole 70, but may have a shape to cover a surface of an exposed portion through the contact hole 70. A transparent material for the electrode block 42B may be, for example, indium tin oxide (ITO), indium zinc oxide (IZO), etc. A second insulating layer 74 may be on the electrode block 42B. The second insulating layer 74 may include a transparent material. The second insulating layer 74 may be, for example, a silicon nitride layer, a silicon oxide layer or an organic layer. The second insulating layer 74 may include the contact hole 46. A partial region of the electrode block 42B may be exposed through the contact hole 46. Referring to FIG. 1, the plurality of contact holes 46 may be on the second insulating layer 74. The location of the contact hole 46 may be directly on the contact hole 70 or between the contact hole 70 and the contact hole 70. A thickness t1 of the second insulating layer 74 may be such that a parasite capacitance between the electrode block 42B and the data wire 84 becomes as small as possible. For example, the second insulating layer 74 may have a thickness t1 that is equal to or greater than about 500 nm, and may have an appropriate upper limit thickness. The data wire 84 may be either above or below the electrode block 42B. A first through fifth metal wires 80A-80E may be on the second insulating layer 74. The first through fifth metal wires 80A-80E may be spaced apart from each other. The second metal wire 80B may fill the contact hole 46. The second metal wire 80B may be in contact with the electrode block 42B through the contact hole 46. The first through fifth metal wires 80A-80E may correspond to 5 pieces of metal wire 44 traversing the second column of the electrode block layer B1 in FIG. 1.

An X-ray visible light converter 100 may be above the first through fifth metal wires 80A-80E. The X-ray visible light converter 100 may convert an incident X-ray 102 and emit it as a light 104. The light 104 may be converted to the current by the photoelectronic conversion device 64. The light 104 may be, for example, a visible light or an infrared light.

A method of manufacturing an X-ray detector is described with reference to FIGS. 7 through 11 according to an example embodiment. Like reference numerals are used for like elements with respect to a description of the X-ray detector and detailed descriptions thereof will be omitted here. Manufacturing processes illustrated in FIGS. 7 through 11 refer to a result shown as the cross-section, cut along a line 6-6' in FIG. 1. Thus, even though the manufacturing process for a TFT is not shown in FIGS. 7 through 11, the TFT and the manufacturing process thereof may be apparent to those of ordinary skill in the art.

Figure 7:
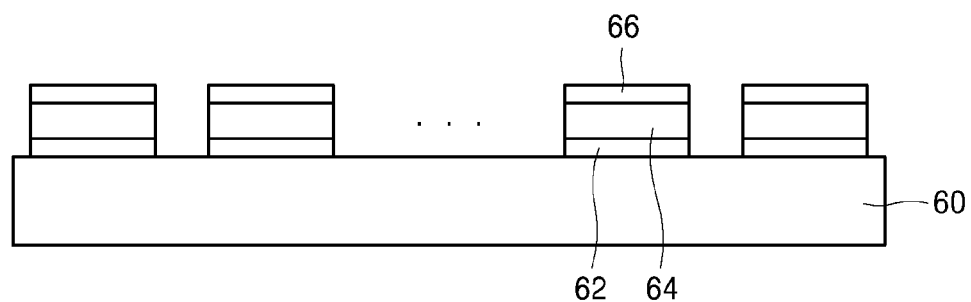
FIGS. 7 through 11 are cross-sectional views illustrating step-by-step a manufacturing method according to an example embodiment.

Referring to FIG. 7, a plurality of first electrodes 62 may be formed on a substrate 60. After a first electrode layer is formed on the substrate 60, the first electrodes 62 may be formed by patterning the first electrode layer into a shape arranged for the first electrodes 62 and using photographing and etching processes of the related art. A photoelectronic conversion device 64 and a second electrode 66 may be sequentially formed above the first electrode 62. The first electrode 62, the photoelectronic conversion device 64 and the second electrode 66 may be formed at the same time. For example, the result of FIG. 7 may be obtained by sequential laminating of the first electrode layer forming the first electrode 62, a photoelectronic conversion device layer and a second electrode layer forming the second electrode 66, and by sequential patterning of the second electrode layer, the photoelectronic conversion device layer, and the first electrode layer.

Figure 8:
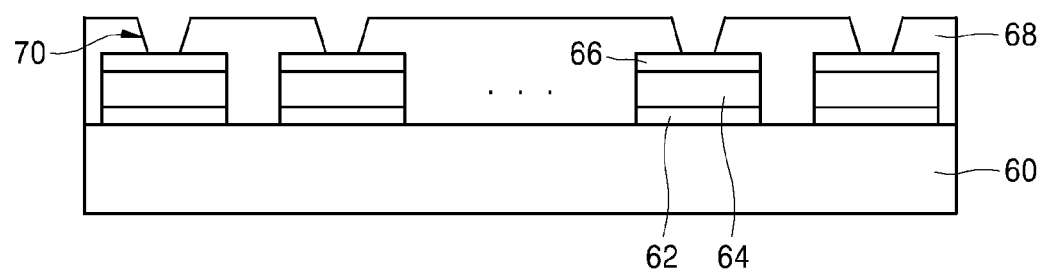

Referring to FIG. 8, a first insulating layer 68 configured to cover the first and second electrodes 62, 66 and the photoelectronic conversion device 64 may be formed on the substrate 60. A contact hole 70, through which the second electrode 62 may be exposed, may be formed on the first insulating layer 68. The number of contact holes 70 may be formed equal to that of the photoelectronic conversion device 64.

Figure 9:
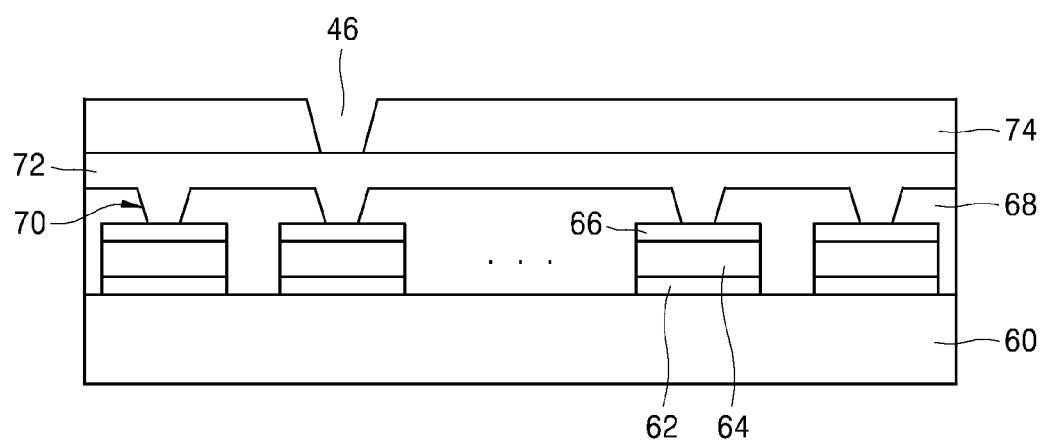

As illustrated in FIG. 9, an electrode layer 72 configured to fill the contact hole 70 may be formed on the first insulating layer 68. The electrode 72 may correspond to an electrode block 42B. The electrode layer 72 may be manufactured by forming a conductive layer over an entire area of a panel 40 of the X-ray detector and by patterning the conductive layer with a plurality of electrode blocks as illustrated in FIG. 1. The conductive layer may be patterned to obtain results as illustrated in FIGS. 2 and 3, in a patterning process of the conductive layer. A second insulating layer 74 may be formed on the electrode layer 72. A contact hole 46 may be formed on the second insulating layer 74. The contact hole 46 may be formed directly above the contact hole 70 formed in the first insulating layer 68; however, it may be formed on the second insulating layer 74 between the contact hole 70 and the contact hole 70. A plurality of contact holes 46 may be formed.

Figure 10:
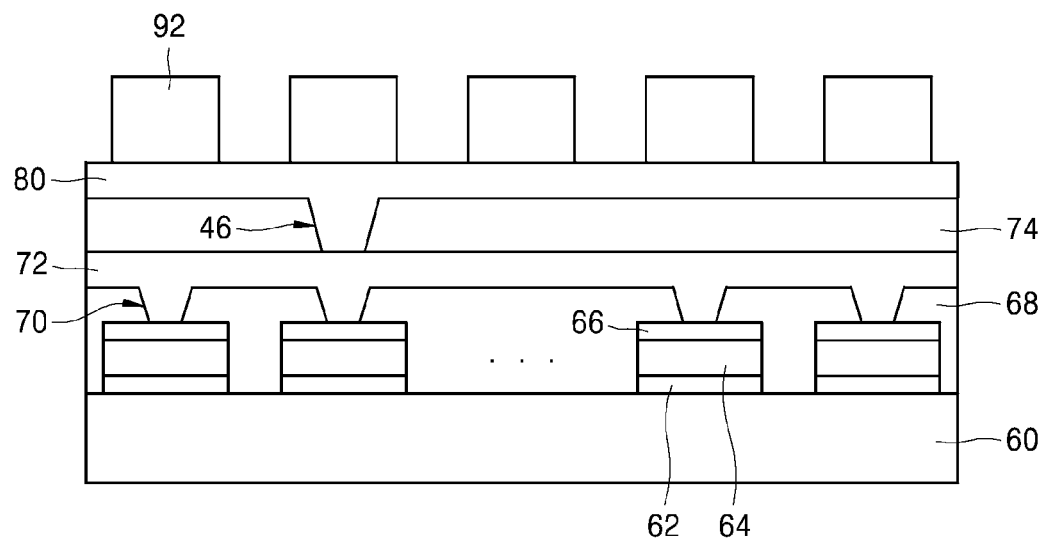

Referring to FIG. 10, the conductive layer 80 configured to fill the contact hole 46 may be formed on the second insulating layer 74. The conductive layer 80 may include, for example, a metal or an alloy. The metal may be, for example, aluminum or a metal having a resistance similar to or lower than that of aluminum. The alloy may be, for example, an aluminum alloy or an alloy having a resistance similar to or lower than that of an aluminum alloy. A mask 92 may be formed on the conductive layer 80. A purpose of the mask 92 is to limit a region of a metal wire 44 in FIG. 1 or a first through fifth metal wires 80A-80E in FIG. 6. After the mask is formed, the conductive layer 80 in an area surrounding the mask may be etched. In this case, the process of etching may be performed until the second insulating layer 74 may be exposed.

Figure 11:
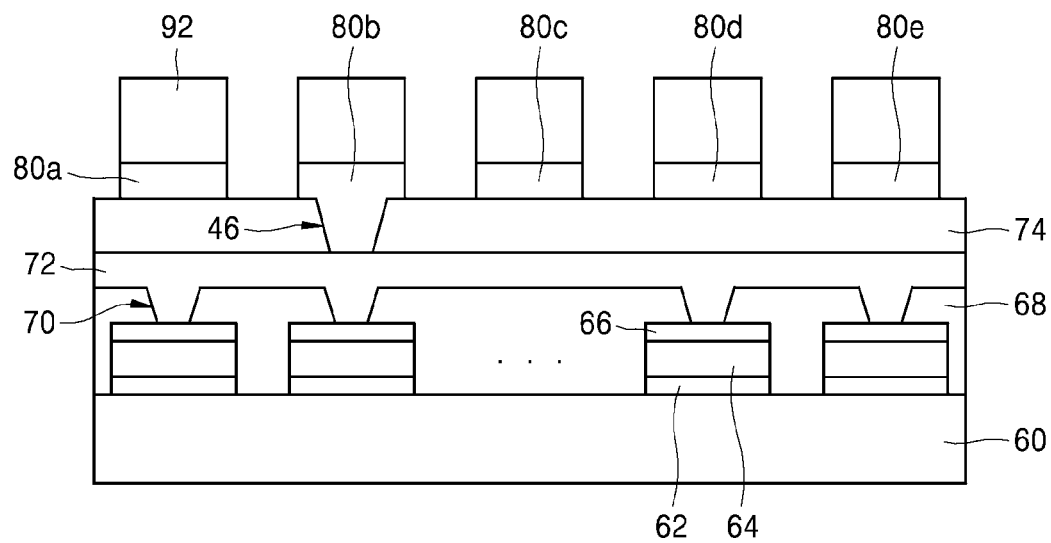

FIG. 11 illustrates a result of the process of etching.

Referring to FIG. 11, it is shown that a first through fifth metal wires 80A-80E may be formed on the second insulating layer 74, after the process of etching. The mask 92 may be removed after the first through fifth metal wires 80A-80E may be formed.

In the manufacturing processes in FIGS. 7 through 11, a cumulative ammeter circuit C1 may be formed together, or separately also.

A system including an X-ray detector is described below according to one or more exemplary embodiments of the present concept.

Figure 12:
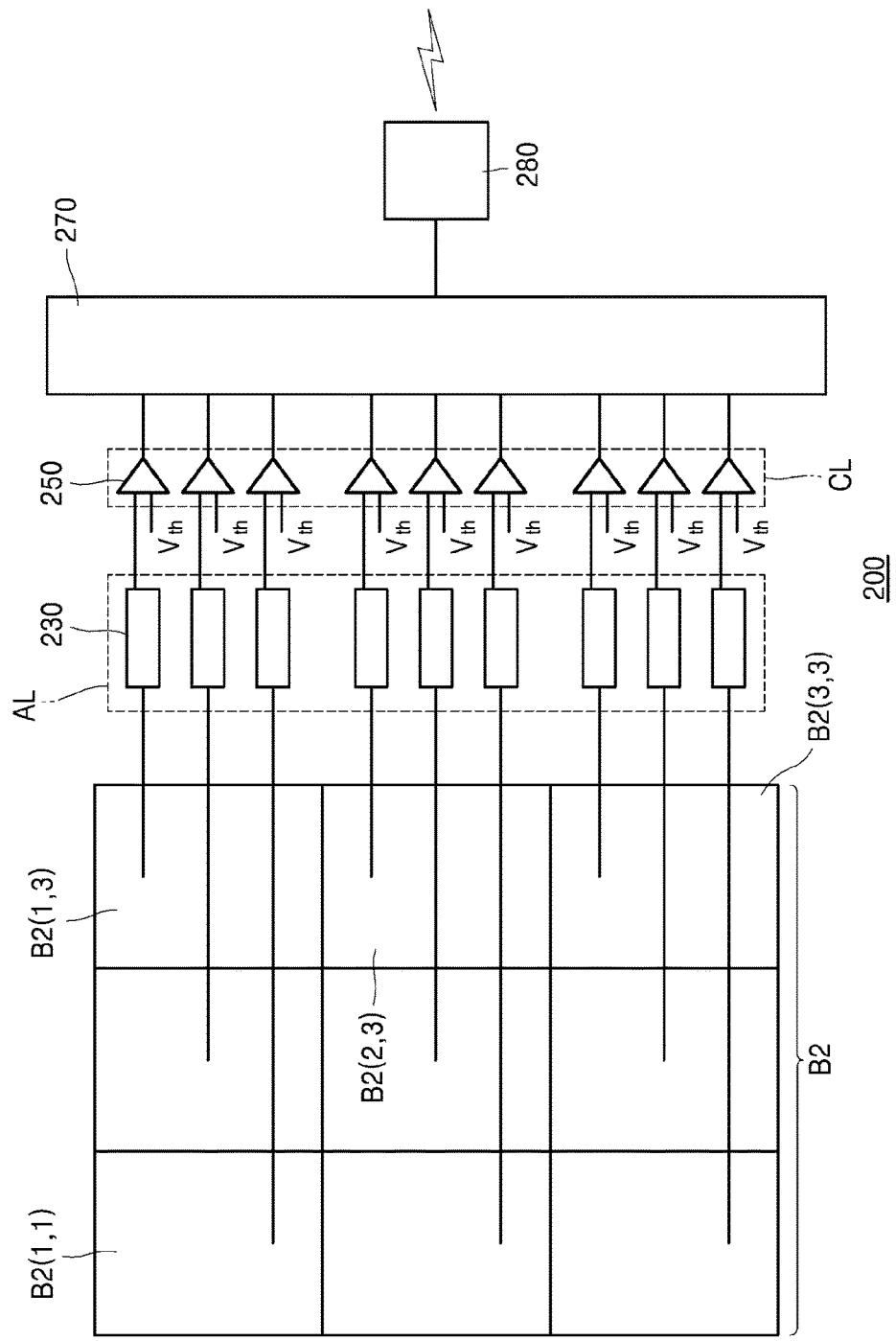
FIG. 12 is a plan view of an X-ray detector system according to an example embodiment.

FIG. 12 is a plan view of the system including the X-ray detector according to an example embodiment. In FIG. 12, a reference numeral B2 refers to an electrode block layer. The electrode block layer B2 is illustrated to include 9 pieces of electrode blocks B(1,1)-B(3,3); however, it is for the sake of convenience only. Thus, the number of electrode blocks included in the electrode block layer B2 may be different from 9. For example, the number of electrode blocks included in the electrode block layer B2 may be different from 9, and may be equal to that of electrode blocks included in an electrode block layer B1 illustrated in FIG. 1.

In a description of FIG. 12, the electrode block layer B2 is substituted by the X-ray detector for the sake of convenience.

Referring to FIG. 12, an X-ray detector system 200 may include a first array AL connected to the electrode block layer B2. The first array AL may include a plurality of amplifiers 230. The plurality of amplifiers 230 may be analog amplifiers. The number of the plurality of amplifiers 230 may be equal to that of electrode blocks B2(1,1)-B2(3,3) included in the electrode block layer B2. The plurality of amplifiers 230 may be in one-to-one connection with electrode blocks B2(1,1)-B2(3,3). Thus, one of amplifiers 230 may amplify a cumulative current amount of a corresponding electrode block B2(1,3). A bias voltage $V_{bias}$ may be applied to each of the plurality of amplifiers 230. Thus, each of electrode blocks B2(1,1)-B2(3,3) connected to the plurality of amplifiers 230 may be maintained at equipotential. In other words, a top common electrode of electrode blocks B2(1,1)-B2(3,3) may be maintained at equipotential.

A connection between the plurality of amplifiers 230 and electrode blocks B2(1,1)-B2(3,3) are simply illustrated in FIG. 12. However, each of the plurality of amplifiers 230 may be connected to a plurality of metal wires traversing electrode blocks B2(1,1)-B2(3,3) (for example, refer to a metal wire 44 in FIG. 1). As an example, FIG. 13 illustrates a connection between the electrode block B2(1,3) located at first row and third column of the electrode block layer B2 in FIG. 12, and a corresponding amplifier 230.

Figure 13:
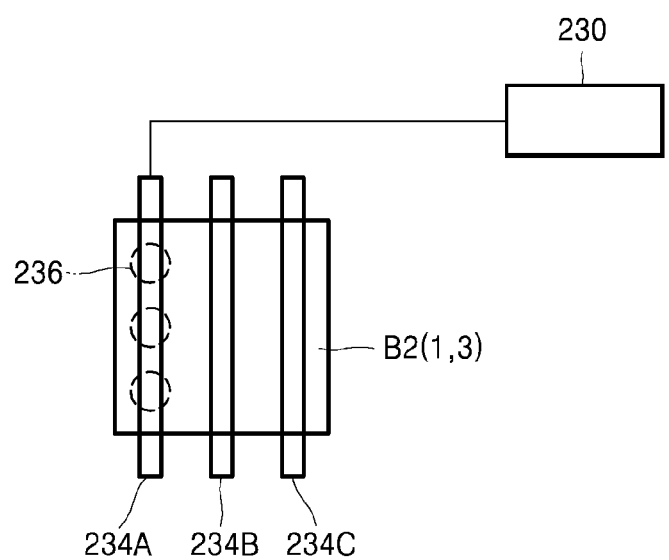
FIG. 13 is a plan view illustrating a connection of an electrode block located at first row and third column in an electrode block layer in FIG. 12 and an amplifier corresponding to the electrode block.

Referring to FIG. 13, a first metal wire 234A from among a first through third metal wires 234A, 234B, 234C traversing the electrode block B2(1,3) may be connected to the amplifier 230. The second metal wire 234B may be in contact with an electrode block B2(3,2) located at third row and second column, and be connected to an amplifier corresponding to the electrode block B2(3,2). The third metal wire 234C may be in contact with an electrode block B2(3,3) located at third row and third column, and be connected to an amplifier corresponding to the electrode block B2(3,3). A reference numeral 236 in FIG. 13 indicates contact holes existing between the first metal wire 234A and the electrode block B2(1,3).

Referring to FIG. 12 again, the X-ray detector system 200 may include a control unit 270 configured to control electrode blocks B2(1,1)-B2(3,3) of the electrode block layer B2, and a wireless transmitter 280 connected to the control unit 270. In addition, the X-ray detector system 200 may include a second array CL between the first array AL and the control unit 270. The second array CL may be connected to the first array AL and the control unit 270. Both the first and second arrays AL, CL may be commonly referred to as analog front ends (AFEs). The control unit 270 may apply a predetermined threshold voltage $V_{th}$ to the second array CL. In addition, the control unit 270 may control a movement of an electrode block selected from the electrode block layer B2, for example, an AEC sensor block including the electrode block B2(1,3). In addition, when a voltage based on a cumulative current amount measured from a selected electrode block in an X-ray irradiation process may be more than or equal to the predetermined threshold voltage $V_{th}$, the control unit 270 may stop an operation of an high voltage generator or an X-ray generator, by sending a control signal via a wireless transmitter 280. In this manner, an appropriate X-ray dose may be irradiated. The second array CL may include a plurality of comparators 250. The number of the plurality of comparators 250 may be equal to that of the plurality of amplifiers 230 forming the first array AL. The plurality of comparators 250 may be in one-to-one contact with the plurality of amplifiers 230. Two signals may be input to each of the plurality of comparators 250; one is a signal or an output signal provided by a corresponding amplifier 230 and the other is the predetermined threshold voltage $V_{th}$ provided by the control unit 270. Thus, the plurality of comparators 250 may compare the output signal from each of the plurality of amplifiers 230 with the threshold voltage $V_{th}$ provided by the control unit 270. Then, the plurality of comparators 250 may inform the control unit 270 of whether an X-ray irradiation dose is appropriate, or whether the output signal has reached the threshold voltage $V_{th}$ or exceeded the threshold voltage $V_{th}$ in a predetermined range; whether the X-ray irradiation is insufficient, or whether the output signal is less than the threshold voltage $V_{th}$; and whether the X-ray irradiation is excessive, or whether the output signal is greater than the threshold beyond the predetermined range. The control unit 270 may stop or maintain the X-ray irradiation in accordance with the output signal of the comparators 250. In this process, the control unit 270 may accept at least one of selected results of the comparators 250, as an input signal. The control unit 270 may perform a final control through arithmetic operations such as AND, OR and NOT operations on the accepted at least one of selected results of the comparators 250. In other words, the control unit 270 may generate a final control signal.

Figure 14:
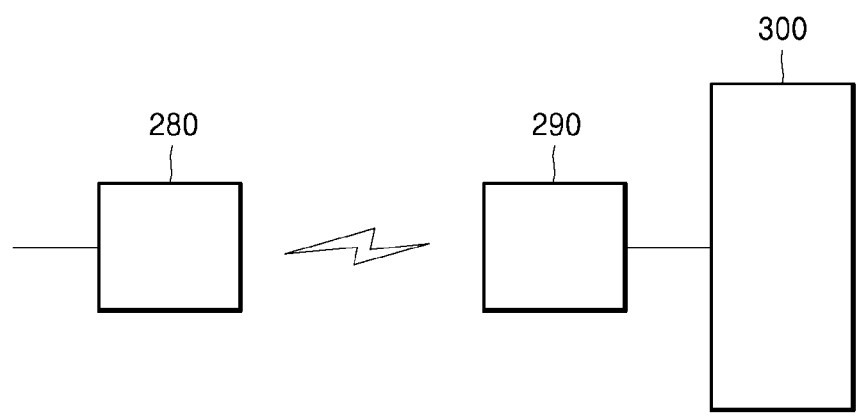
FIG. 14 is a plan view illustrating a case in which a control signal, transmitted via a wireless transmitter in an X-ray detector system in FIG. 12, is transferred via a wireless receiver to a high voltage generator.

The control signal of the control unit 270 wirelessly transmitted via the wireless transmitter 280 may be transmitted to the high voltage generator 300 via a wireless receiver 290 as illustrated in FIG. 14. When a signal received via the wireless receiver 290 may be a stop-operation signal, the high voltage generator 300 may stop an operation in accordance with such signal. When the signal received via the wireless receiver 290 may not be a stop-operation signal, the operation of the high voltage generator 300 may be maintained and the X-ray irradiation may be continued. The wireless transmitter 280 and the high voltage generator 300 may be included in the X-ray detector system 200.

The cumulative ammeter circuit C1 in FIG. 1 may include the first and second arrays AL and CL.

An operation of the X-ray detector system 200 described above is briefly reviewed with reference to FIG. 15 and FIG. 16.

Figure 15:
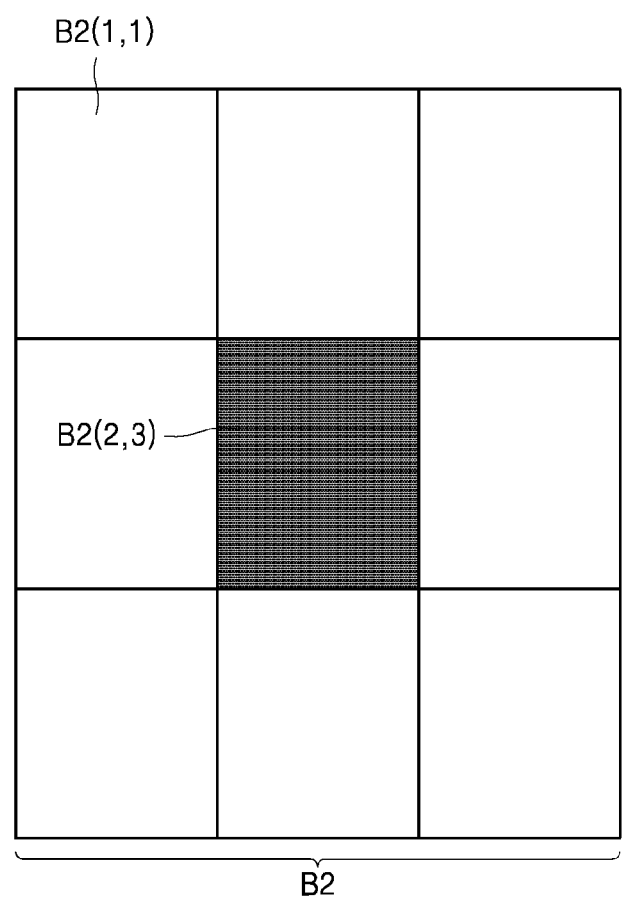
FIG. 15 and FIG. 16 are plan views illustrating a method of operating an X-ray detector system according to an example embodiment.

Firstly, as illustrated in FIG. 15, an electrode block, for example, B2(2,2) from an electrode block layer B2 may be selected to measure an appropriate exposure of the X-ray. Selection of the electrode block B2(2,2) may be determined by a user of the X-ray detector system 200.

Figure 16:
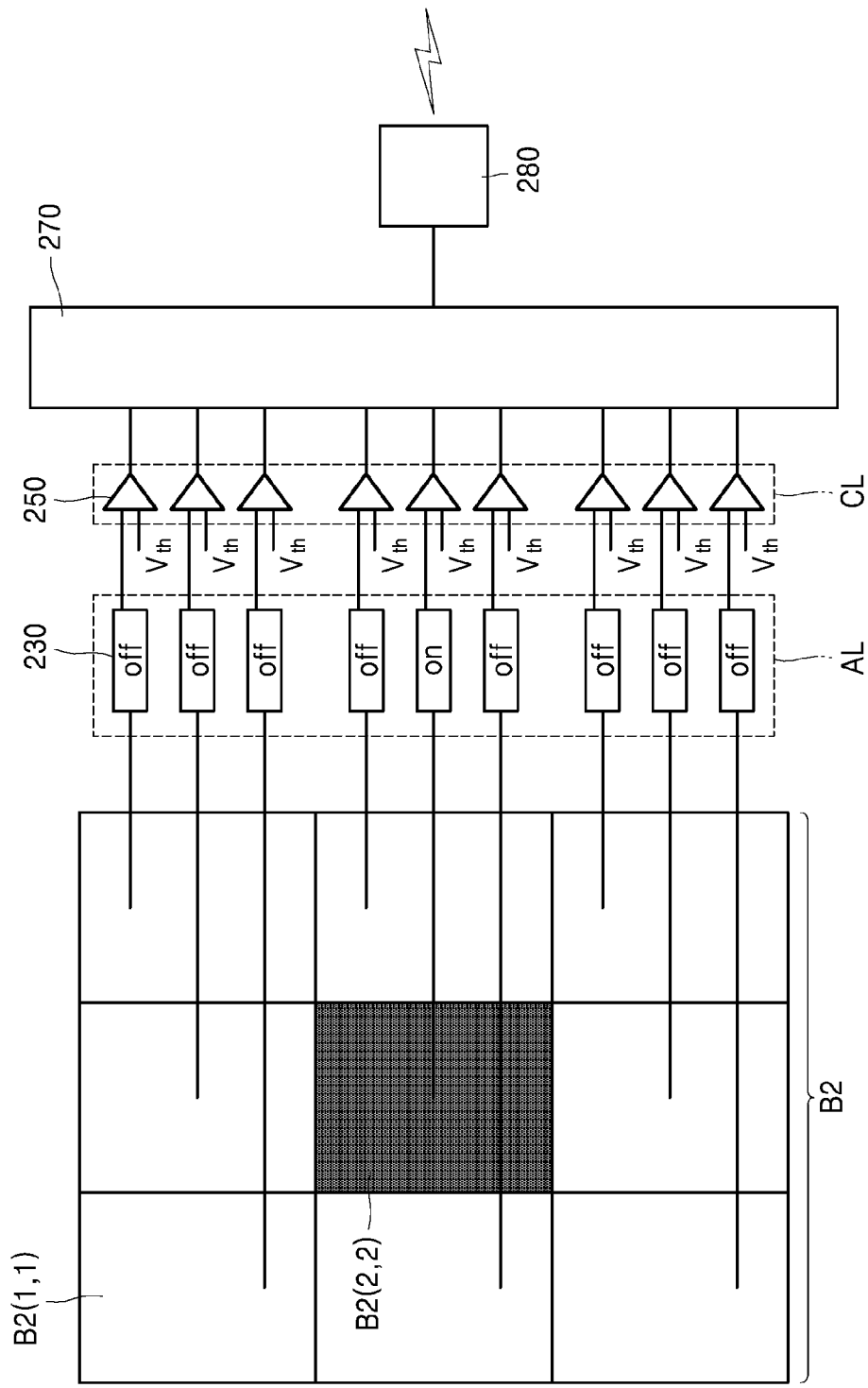

Next, as illustrated in FIG. 16, all amplifiers may maintain an off state or a grounding state, except an amplifier connected to the electrode block B2(2,2) and selected in the first array AL. In this state, the X-ray irradiation may be proceeded, and a voltage based on a cumulative current amount in the selected electrode block B2(2,2) may be put in as an input signal to a comparator corresponding to the selected electrode block B2(2,2). The comparator corresponding to the selected electrode block B2(2,2) may compare this input signal with the threshold voltage $V_{th}$ provided from the control unit 270. When the input signal is equal to or higher than the threshold voltage $V_{th}$ as a comparison result, the comparator may transmit a predetermined output signal, for example, a signal corresponding to "1" to the control unit 270. In accordance with such signal, the control unit 270 may transmit a control signal, for example, the stop-operation signal to the high voltage generator 300 via the wireless transmitter 280. The operation of the high voltage generator 300 may be stopped in accordance with the control signal. Thus, the X-ray irradiation operation may be controlled.

Since the X-ray detector itself may include an AEC function, the X-ray detector may be diversely utilized outside a bucky. Since an entire panel may be used as the AEC region by forming electrode blocks in a shape of a M by N matrix on the panel of the X-ray detector, or a partial region only of the panel may be selectively used as the AEC region, various protocols may be responded, various types of patients may be served, and a homogeneous image quality may be obtained.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more example embodiments have been described with reference to the figures, it will be understood by those of ordinary skill in the art that various changes in form and details may be made therein without departing from the spirit and scope as defined by the following claims.

What is claimed is:

1. An X-ray detector, comprising:
   a substrate;
   a plurality of pixels on the substrate;
   a first insulating layer configured to cover the plurality of pixels;
   an electrode block configured to penetrate the first insulating layer and be in electrical contact with the plurality of pixels;
   a second insulating layer on the electrode block; and
   a metal wire configured to penetrate the second insulating layer and be in electrical contact with the electrode block.

2. The X-ray detector of claim 1, wherein each of the plurality of pixels comprises:
   a first electrode on the substrate;
   a photoelectronic conversion device on the first electrode; and
   a second electrode on the photoelectronic conversion device.

3. The X-ray detector of claim 1, wherein contact holes, a contact hole number of which is equal to a pixel number of the plurality of pixels, are formed in the first insulating layer, and the electrode block is provided in the contact holes.

4. The X-ray detector of claim 1, wherein a plurality of contact holes, through which the electrode block is exposed, exist in the second insulating layer, and the metal wire is provided in the contact holes.

5. The X-ray detector of claim 1, wherein a plurality of metal wires are on the second insulating layer, and the plurality of metal wires are in electrical contact with a plurality of electrode blocks.

6. The X-ray detector of claim 1, wherein the second insulating layer has a thickness equal to or greater than about 500 nm and has an upper limit thickness.

7. The X-ray detector of claim 1, wherein the electrode block comprises a plurality of contact holes between two adjacent pixels among the plurality of pixels.

8. The X-ray detector of claim 1, wherein a width of the electrode block between two adjacent pixels among the plurality of pixels is narrower than another area width.

9. A method of manufacturing an X-ray detector, the method comprising:
   forming a plurality of pixels on a substrate;
   forming a first insulating layer, configured to cover the plurality of pixels, on the substrate;
   forming a plurality of first contact holes, through which the plurality of pixels are exposed, in the first insulating layer;
   forming an electrode block, configured to be in contact with the exposed pixels, on the first insulating layer;
   forming a second insulating layer on the electrode block;
   forming a second contact hole, through which a portion of the electrode block is exposed, in the second insulating layer; and
   forming a metal wire, configured to be provided in the second contact hole, on the second insulating layer, to be in electrical contact with the electrode block.

10. The method of claim 9, wherein the forming of the plurality of pixels comprises:
    forming a first electrode on the substrate;
    forming a photoelectronic conversion device on the first electrode; and
    forming a second electrode on the photoelectronic conversion device.

11. The method of claim 9, wherein the electrode block is configured to cover a surface exposed through the first contact holes, without filling the first contact holes.

12. The method of claim 9, wherein the forming of the electrode block comprises forming a plurality of contact holes in the electrode block between two adjacent pixels among the plurality of pixels.

13. The method of claim 9, wherein a width of the electrode block between two adjacent pixels among the plurality of pixels is configured to be narrower than another area width.

14. The method of claim 9, wherein a plurality of electrode blocks spaced apart from each other are formed on the first insulating layer, a plurality of metal wires are formed on the second insulating layer, and the plurality of metal wires are configured to be in electrical contact with the plurality of electrode blocks.

15. The method of claim 9, wherein the second insulating layer is configured to have a thickness equal to or greater than about 500 nm, and have an upper limit thickness.

16. The method of claim 9, wherein the forming the electrode block comprises forming a back bias electrode block, configured to be in contact with the exposed pixels, on the first insulating layer.

17. An X-ray detector system, the system, comprising:
an X-ray detector comprising a plurality of electrode blocks, an electrode block among the plurality of electrode blocks being in electrical contact with a plurality of pixels;
an array connected to the plurality of electrode blocks;
a control unit connected to the array; and
a wireless transmitter connected to the control unit.

18. The X-ray detector system of claim 17, wherein the array comprises:
a first array comprising a plurality of amplifiers in one-to-one correspondence with the plurality of electrode blocks; and
a second array comprising a plurality of comparators in one-to-one correspondence with the plurality of amplifiers.

19. The X-ray detector system of claim 17, further comprising
a wireless receiver configured to receive a signal provided from the control unit; and
a high voltage generator connected to the wireless receiver.

20. A method of operating an X-ray detector system, the method comprising:
selecting an electrode block from an electrode block layer, and electrode block among the plurality of electrode blocks being in electrical contact with a plurality of pixels;
operating an amplifier only connected to a selected electrode block from an amplifier array connected to the electrode block layer;
applying a threshold voltage, predetermined as an input signal, to a comparator connected to the operated amplifier;
irradiating an X-ray to the pixels of the selected electrode block;
comparing a signal provided from an operated amplifier with the threshold voltage after irradiation of the X-ray has started; and
controlling the irradiation of the X-ray in accordance with a result of the comparing.

21. The method of claim 20, wherein the controlling of the irradiation of the X-ray in accordance with a comparison result comprises:
transmitting the comparison result to a control unit;
generating a control signal in the control unit in accordance with the comparison result; and
transmitting the control signal to a high voltage generator.

22. The method of claim 20, wherein the amplifier array comprises a plurality of amplifiers, and the plurality of amplifiers are in one-to-one correspondence with a plurality of electrode blocks comprised in the electrode block layer.

* * * * *